(12) United States Patent
Akiyama et al.

(10) Patent No.: US 7,977,209 B2
(45) Date of Patent: Jul. 12, 2011

(54) METHOD FOR MANUFACTURING SOI SUBSTRATE

(75) Inventors: Shoji Akiyama, Gunma (JP); Yoshihiro Kubota, Gunma (JP); Atsuo Ito, Gunma (JP); Makoto Kawai, Gunma (JP); Yuuji Tobisaka, Gunma (JP); Koichi Tanaka, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 230 days.

(21) Appl. No.: 12/161,819

(22) PCT Filed: Feb. 8, 2007

(86) PCT No.: PCT/JP2007/052232
§ 371 (c)(1),
(2), (4) Date: Jul. 23, 2008

(87) PCT Pub. No.: WO2007/091639
PCT Pub. Date: Aug. 16, 2007

(65) Prior Publication Data
US 2010/0227452 A1    Sep. 9, 2010

(30) Foreign Application Priority Data
Feb. 9, 2006 (JP) .................................. 2006-031913

(51) Int. Cl.
  *H01L 21/30* (2006.01)
  *H01L 21/46* (2006.01)
(52) U.S. Cl. ................ 438/458; 438/530; 257/E21.568; 257/E21.32
(58) Field of Classification Search .................. 438/455, 438/458, 459, 530, FOR. 106, FOR. 447; 257/E21.32, E21.568
See application file for complete search history.

(56) References Cited

U.S. PATENT DOCUMENTS
6,146,979 A    11/2000    Henley et al.
(Continued)

FOREIGN PATENT DOCUMENTS
JP    11 67740    3/1999
(Continued)

OTHER PUBLICATIONS

Auberton-Herve, A.-J. et al., "Smart Cut Technology: Industrial Status of Soi Wafer Production and New Material Developments", Electrochemical Society Proceedings, vol. 99-3, pp. 93-106, (1999).

(Continued)

*Primary Examiner* — Matthew Smith
*Assistant Examiner* — Quovaunda Jefferson
(74) *Attorney, Agent, or Firm* — Oblon, Spivak, McClelland, Maier & Neustadt, L.L.P.

(57) ABSTRACT

A heating plate having a smooth surface is placed on a hot plate which constitutes a heating section, and the smooth surface of the heating plate is closely adhered on the rear surface of a single-crystal Si substrate bonded to a transparent insulating substrate. The temperature of the heating plate is kept at 200° C. or higher but not higher than 350° C. When the rear surface of the single-crystal Si substrate bonded to the insulating substrate is closely adhered on the heating plate, the single-crystal Si substrate is heated by thermal conduction, and a temperature difference is generated between the single-crystal Si substrate and the transparent insulating substrate. A large stress is generated between the both substrates due to rapid expansion of the single-crystal Si substrate, thus separation takes place at a hydrogen ion-implanted interface.

9 Claims, 2 Drawing Sheets

U.S. PATENT DOCUMENTS

| | | | |
|---|---|---|---|
| 6,155,909 | A | 12/2000 | Henley et al. |
| 6,159,824 | A | 12/2000 | Henley et al. |
| 6,159,825 | A | 12/2000 | Henley et al. |
| 6,162,705 | A | 12/2000 | Henley et al. |
| 6,263,941 | B1 | 7/2001 | Bryan et al. |
| 6,486,008 | B1 | 11/2002 | Lee |
| 6,513,564 | B2 | 2/2003 | Bryan et al. |
| 6,537,938 | B1 | 3/2003 | Miyazaki |
| 6,582,999 | B2 | 6/2003 | Henley et al. |
| 6,600,173 | B2 * | 7/2003 | Tiwari .............................. 257/74 |
| 7,399,681 | B2 * | 7/2008 | Couillard et al. ............. 438/458 |
| 7,462,552 | B2 * | 12/2008 | Tong et al. .................... 438/458 |
| 2001/0038988 | A1 * | 11/2001 | Oda et al. .......................... 432/5 |
| 2003/0113983 | A1 | 6/2003 | Henley et al. |
| 2004/0058555 | A1 | 3/2004 | Moriceau et al. |
| 2004/0248379 | A1 | 12/2004 | Maleville et al. |
| 2005/0255670 | A1 | 11/2005 | Couillard et al. |
| 2006/0141747 | A1 | 6/2006 | Henley et al. |

FOREIGN PATENT DOCUMENTS

| | | |
|---|---|---|
| JP | 3048201 | 6/2000 |
| JP | 2001 507525 | 6/2001 |
| JP | 2001 525991 | 12/2001 |
| JP | 2005 142524 | 6/2005 |
| JP | 2005 166911 | 6/2005 |
| WO | WO 2005/029576 | 3/2005 |

OTHER PUBLICATIONS

U.S. Appl. No. 12/158,047, filed Jun. 19, 2008, Kawai, et al.
U.S. Appl. No. 12/161,694, filed Jul. 22, 2008, Akiyama, et al.
U.S. Appl. No. 12/161,821, filed Jul. 23, 2008, Akiyama, et al.
U.S. Appl. No. 12/162,134, filed Jul. 25, 2008, Akiyama, et al.
U.S. Appl. No. 12/282,176, filed Sep. 9, 2008, Akiyama, et al.
U.S. Appl. No. 12/281,886, filed Sep. 5, 2008, Akiyama et al.
Supplementary European Search Report dated Nov. 16, 2010.

* cited by examiner

METHOD FOR MANUFACTURING SOI SUBSTRATE

TECHNICAL FIELD

The present invention relates to a method for manufacturing an SOI substrate having a single-crystal silicon thin film on a transparent insulating substrate.

BACKGROUND ART

As a method for manufacturing an SOI substrate, there are known the SmartCut method, the SiGen method, and the like based on conventional bonding.

The SmartCut method is a method in which a silicon substrate, on the bonding side of which hydrogen ions have been implanted, and a substrate made also of silicon or of another material are bonded together and subjected to a heat treatment at a temperature of 400° C. or higher (for example, 500° C.). Then, a silicon thin film is thermally peeled off from a region where the concentration of the implanted hydrogen ions is highest, thus obtaining an SOI substrate (see, for example, Japanese Patent No. 3048201 (patent document 1) and A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) pp. 93-106) (non-patent document 1)).

The SiGen method is a method in which before a silicon substrate, on the bonding side of which hydrogen ions have been implanted, and a substrate made also of silicon or of another material are bonded together, both or either one of the bonding faces of these substrates is plasma-treated. The two substrates are then bonded together with the surfaces thereof activated. After heat-treating the bonded substrates at a low temperature (for example, 100 to 300° C.) and thereby increasing the bonding strength thereof, a silicon thin film is mechanically peeled off at room temperature, thus obtaining an SOI substrate (see, for example, the specification of U.S. Pat. No. 6,263,941 (patent document 2), the specification of U.S. Pat. No. 6,513,564 (patent document 3), and the specification of U.S. Pat. No. 6,582,999 (patent document 4)).

The difference between these two methods mainly lies in the process of silicon thin film separation. The SmartCut method requires processing at high a temperature for the purpose of silicon thin film separation, whereas the SiGen method makes this separation feasible at room temperature.

As a rule, a silicon substrate and a substrate made of another material are bonded together in the manufacture of a bonded SOI substrate. These materials of different types generally differ from each other in the rate of thermal expansion, intrinsic allowable temperature limits, and the like. Consequently, if the temperature of heat treatment applied to the substrates being bonded in a manufacturing process becomes higher, the substrates are more likely to cause breakage or local cracks due to a difference in thermal properties between the both substrates. From this point of view, the SmartCut method which requires high temperatures for silicon thin film separation can hardly be said preferable as a method for manufacturing an SOI substrate based on the bonding of substrates made of different materials.

On the other hand, the SiGen method capable of low-temperature separation is less likely to cause breakage or local cracks due to the aforementioned difference in thermal properties. However, this method in which a silicon thin film is peeled off mechanically has the problem that it is more likely that the bonded surfaces of the substrates separate from each other, traces of separation arise, or mechanical damage is introduced into the silicon thin film during a separation process.

The present invention has been accomplished in view of the above-described problems. It is therefore an object of the present invention to avoid breakage, local cracks and the like due to a difference in thermal properties between the substrates and the introduction of mechanical damage into an SOI layer in a step of manufacturing an SOI substrate by bonding together a single-crystal silicon substrate and a transparent insulating substrate, thereby providing an SOI substrate having an SOI layer superior in film uniformity, crystal quality, and electrical characteristics (carrier mobility and the like).

DISCLOSURE OF THE INVENTION

In order to solve the above-described problems, a method for manufacturing an SOI substrate in accordance with the present invention includes:

a first step of forming a hydrogen ion-implanted layer on the surface side of a first substrate which is a single-crystal silicon substrate;

a second step of applying a surface activation treatment to at least one of the surface of a second substrate which is a transparent insulating substrate and the surface of the first substrate;

a third step of bonding together the surface of the first substrate and the surface of the second substrate; and a fourth step of forming an SOI layer on the surface of the second substrate by closely adhering the rear surface of the first substrate of the bonded substrates on a heating plate kept at a temperature of 200° C. or higher but not higher than 350° C. to heat the first substrate and thereby peel off a silicon layer from the first substrate.

In the present invention, the second substrate is preferably one of a quartz substrate, a sapphire (alumina) substrate, a borosilicate glass substrate, and a crystallized glass substrate.

Further, in the present invention, the amount of hydrogen ion implantation (dose amount) in the first step is preferably $1 \times 10^{16}$ to $5 \times 10^{17}$ atoms/cm$^2$ and the surface activation treatment in the second step is preferably carried out by means of at least one of plasma treatment and ozone treatment.

In the present invention, the third step may include a sub-step of heat-treating the first substrate and the second substrate at 100 to 350° C. after the bonding, with the first and second substrates bonded together.

Further, in the present invention, the heating plate used in the fourth step can be one of a semiconductor substrate and a ceramic substrate having a smooth surface.

Still further, in the present invention, the fourth step may include a sub-step of applying separation-accelerating external impact from an edge of the hydrogen ion-implanted layer before or after the heating of the first substrate.

According to the present invention, the rear surface of the single-crystal Si substrate bonded to the insulating substrate is closely adhered on the heating plate kept at a temperature of 200° C. or higher but no higher than 350° C. to generate a temperature difference between the single-crystal Si substrate and the transparent insulating substrate, thereby producing a large stress between the both substrates and peeling off the silicon thin film. Therefore, breakage, local cracks and the like due to a difference in thermal properties between the substrates and the introduction of mechanical damage into the silicon thin film peeled off from a surface region of the silicon substrate are avoided. As a result, it is possible to provide an SOI substrate having an SOI layer superior in film uniformity, crystal quality, and electrical characteristics (carrier mobility and the like).

BEST MODE FOR CARRYING OUT THE INVENTION

Hereinafter, the best mode for carrying out the present invention will be described with reference to the accompanying drawings.

Figure 1:
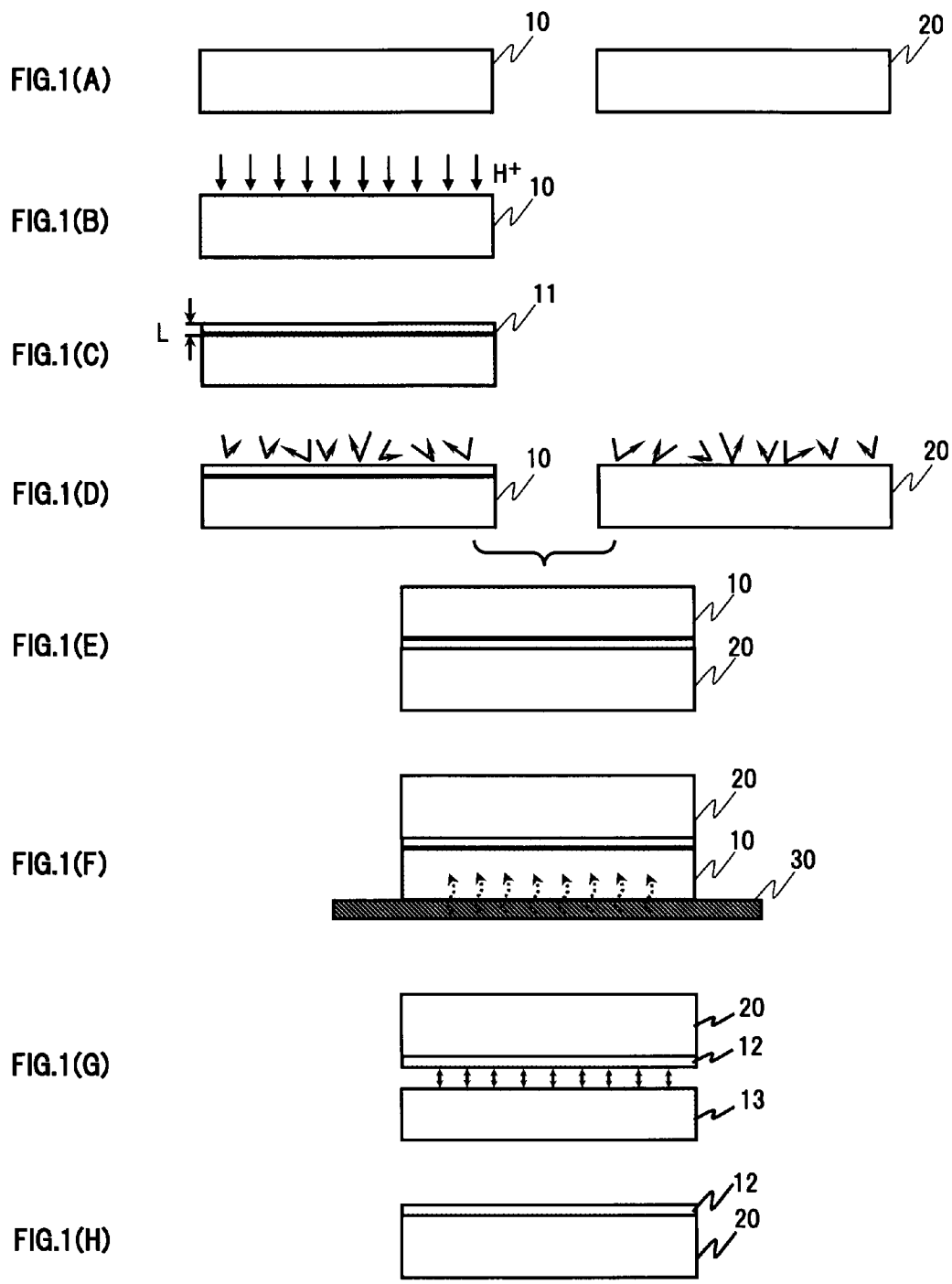
FIGS. 1(A)-(H) are schematic views used to explain a manufacturing process example of an SOI substrate in accordance with the present invention.

FIG. 1 is a schematic view used to explain a manufacturing process example of an SOI substrate in accordance with the present invention. A first substrate 10 illustrated in FIG. 1(A) is a single-crystal Si substrate and a second substrate 20 is a transparent insulating substrate, such as a quartz substrate, a sapphire (alumina) substrate, a borosilicate glass substrate, or a crystallized glass substrate.

Here, the single-crystal Si substrate 10 is, for example, a commercially-available Si substrate grown by the Czochralski (CZ) method. The electrical property values, such as the conductivity type and specific resistivity, the crystal orientation, and the crystal diameter of the single-crystal Si substrate 10 are selected as appropriate, depending on the design value and process of a device to which the SOI substrate manufactured using the method of the present invention is devoted or on the display area of a device to be manufactured.

Note that the diameters of these substrates are the same. For the sake of convenience in a subsequent device formation process, it is advantageous to provide the same orientation flat (OF) as the OF provided in the single-crystal Si substrate 10 also in the transparent insulating substrate 20, and bond the substrates together by aligning these OFs with each other.

First, hydrogen ions are implanted into a surface of the first substrate (single-crystal Si substrate) 10, to form a hydrogen ion-implanted layer (FIG. 1(B)). This ion-implanted surface serves as a later-discussed "bonding surface". As the result of this hydrogen ion implantation, a uniform ion-implanted layer 11 is formed in near a surface of the single-crystal Si substrate 10 at a predetermined depth (average ion implantation depth L). In a region at a depth corresponding to the average ion implantation depth L in a surface region of the single-crystal Si substrate 10, there is formed a "microbubble layer" which exists locally in the aforementioned region (FIG. 1(C)).

The depth of the ion-implanted layer 11 from the surface of the single-crystal Si substrate 10 (average ion implantation depth L) is controlled by an acceleration voltage at the time of ion implantation and is determined depending on how thick an SOI layer to be peeled off is desired. For example, the average ion implantation depth L is set to 0.5 µm or less and ion implantation conditions are specified so that a dose amount is $1 \times 10^{16}$ to $5 \times 10^{17}$ atoms/cm$^2$ and an acceleration voltage is 50 to 100 keV.

Note that an insulating film, such as an oxide film, may be previously formed on the ion-implanted surface of the single-crystal Si substrate 10 and ion implantation may be applied through this insulating film in a process of ion implantation into Si crystal, as is commonly practiced to suppress the channeling of implanted ions.

A plasma treatment or an ozone treatment for the purpose of surface cleaning, surface activation and the like is applied to the respective bonding surfaces of the single-crystal Si substrate 10 in which the ion-implanted layer 11 has been formed and the transparent insulating substrate 20 (FIG. 1(D)). Note that such a surface treatment as described above is performed for the purpose of removing organic matter from a surface serving as a bonding surface or achieving surface activation by increasing OH groups on the surface. However, the surface treatment need not necessarily be applied to both of the bonding surfaces of the single-crystal Si substrate 10 and the transparent insulating substrate 20. Rather, the surface treatment may be applied to either one of the two bonding surfaces.

When carrying out this surface treatment by means of plasma treatment, a surface-cleaned single-crystal Si substrate to which RCA cleaning or the like has been applied previously and/or a transparent insulating substrate is mounted on a sample stage within a vacuum chamber, and a gas for plasma is introduced into the vacuum chamber so that a predetermined degree of vacuum is reached. Note that examples of gas species for plasma used here include an oxygen gas, a hydrogen gas, an argon gas, a mixed gas thereof, or a mixed gas of oxygen gas and helium gas for use in the surface treatment of the single-crystal Si substrate. The gas for plasma can be changed as appropriate according to the surface condition of the single-crystal Si substrate or the purpose of use thereof.

If the surface treatment is performed also for the purpose of oxidizing a single-crystal Si surface, a gas containing at least an oxygen gas is used as the gas for plasma. Note that if a substrate, such as a quartz substrate, the surface of which is in an oxidized state, is used as the transparent insulating substrate, there are no particular restrictions on such selection of a type of gas for plasma as described above. High-frequency plasma having an electrical power of approximately 100 W is generated after the introduction of the gas for plasma, thereby applying the surface treatment for approximately 5 to 10 seconds to a surface of the single-crystal Si substrate and/or a surface of the transparent insulating substrate to be plasma-treated, and then finishing the surface treatment.

When the surface treatment is carried out by means of ozone treatment, a surface-cleaned single-crystal Si substrate to which RCA cleaning or the like has been applied previously and/or a transparent insulating substrate is mounted on a sample stage within a chamber placed in an oxygen-containing atmosphere. Then, after introducing a gas for plasma, such as a nitrogen gas or an argon gas, into the chamber, high-frequency plasma having a predetermined electrical power is generated to convert oxygen in the atmosphere into ozone by the plasma. Thus, a surface treatment is applied for a predetermined length of time to a surface of the single-crystal Si substrate and/or a surface of the transparent insulating substrate to be treated.

The single-crystal Si substrate 10 and the transparent insulating substrate 20, to which such a surface treatment as described above has been applied, are bonded together with the surfaces thereof closely adhered to each other as bonding surfaces (FIG. 1(E)). As described above, the surface (bonding surface) of at least one of the single-crystal Si substrate 10 and the transparent insulating substrate 20 has been subjected to a surface treatment by plasma treatment, ozone treatment or the like and is therefore in an activated state. Thus, it is possible to obtain a level of bonding strength fully resistant to mechanical separation or mechanical polishing in a post-process even if the substrates are closely adhered to each other (bonded together) at room temperature. If the substrates need to have an even higher level of bonding strength, there may be provided a sub-step of applying a "bonding process" by heating the substrates at a relatively low temperature in succession to the "bonding" illustrated in FIG. 1(E).

The bonding process temperature at this time is selected as appropriate according to the types of substrates to be used for bonding. If the substrate to be bonded to the single-crystal Si substrate is a transparent insulating substrate, such as a quartz substrate, a sapphire (alumina) substrate, a borosilicate glass substrate or a crystallized glass substrate, the temperature is set to 350° C. or lower, for example, a range from 100 to 350° C.

The reason for selecting the heating temperature of 350° C. or lower in a case where the substrate to be bonded to the single-crystal Si substrate is a transparent insulating substrate (quartz substrate, in particular) is because consideration is given to a difference in thermal expansion coefficient between single-crystal Si and quartz, an amount of strain due to this difference, and a relationship between the amount of strain and the thicknesses of the single-crystal Si substrate 10 and the transparent insulating substrate 20.

If the thicknesses of the single-crystal Si substrate 10 and the transparent insulating substrate 20 are almost the same with each other, thermal strain-induced cracks or separation at a bonding surface occurs due to a difference in rigidity between the both substrates when the substrates are subjected to a heat treatment at a temperature higher than 350° C., since there is a significant difference between the thermal expansion coefficient ($2.33 \times 10^{-6}$) of single-crystal Si and the thermal expansion coefficient ($0.6 \times 10^{-6}$) of quartz. In an extreme case, the breakage of the single-crystal Si substrate or the quartz substrate could occur. Accordingly, the upper limit of the heat treatment temperature is specified as 350° C. and a heat treatment is preferably applied within a temperature range of 100 to 300° C.

In succession to such a bonding process as described above, the rear surface of the single-crystal silicon substrate 10 of the bonded substrates is closely adhered on a heating plate, such as a hot plate, to heat the single-crystal silicon substrate 10 (FIG. 1(F)).

As described above, as the result of hydrogen ion implantation, there is formed a "microbubble layer" which exists locally in a region at a depth corresponding to the average ion implantation depth L. Si atoms having unpaired bonds and high-density "Si—H bonds" are present in this "microbubble layer" and, therefore, the bonding state of elements within the "microbubble layer" and in the vicinity of the region is locally weakened. Consequently, the ion-implanted layer 11 in which the "microbubble layer" has been formed is ready to cause "cleavage" even for a slight amount of thermal energy.

In addition, since the thermal expansion coefficient of silicon crystal is larger than that of a transparent insulating substrate material, a large stress is generated between the both substrates even by heating for a short period of time at a relatively low temperature, thereby providing an environment in which "cleavage" is ready to occur.

In the present invention, thermal energy necessary for "cleavage" is provided to peel off a silicon thin film by means of heating for a short period of time at a relatively low temperature, by taking advantage of the local weakening of chemical bonds within the ion-implanted layer 11 of the hydrogen ion-implanted single-crystal Si substrate 10 and a difference in thermal expansion coefficient between the Si substrate and the transparent insulating substrate 20.

Figure 2:
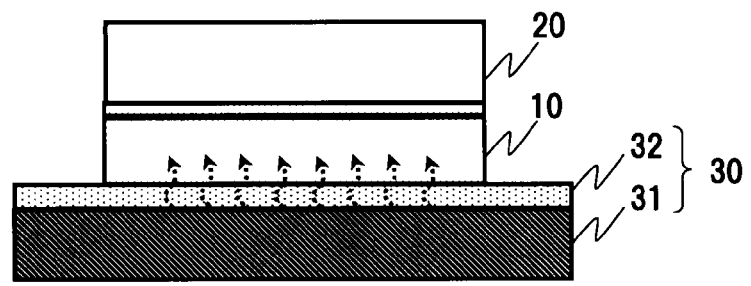
FIG. 2 is a conceptual schematic view used to explain a way of heat treatment for silicon thin film separation.

FIG. 2 is a conceptual schematic view used to explain a way of heat treatment of the substrate for silicon thin film separation. In this figure, reference numeral 30 denotes a heating section. A heating plate 32 having a smooth surface is placed on a hot plate 31, and the smooth surface of this heating plate 32 is closely adhered on the rear surface of the single-crystal Si substrate 10 bonded to the transparent insulating substrate 20. Although a dummy silicon substrate is used here as the heating plate 32, there are no particular restrictions on the material of the heating plate as long as a smooth surface is available (semiconductor substrate or ceramic substrate).

Silicone rubber and the like can also be used as the heating plate material, but is not suited for use at temperatures above 250° C. since the allowable temperature limit of the rubber is considered to be approximately 250° C. The heating plate 32 need not be used in particular, as long as the surface of the hot plate 31 is sufficiently smooth. Alternatively, the hot plate 31 itself may be used as the "heating plate."

The temperature of the heating plate 32 is kept at 200° C. or higher but not higher than 350° C. When the rear surface of the single-crystal Si substrate 10 bonded to the insulating substrate 20 is closely adhered on this heating plate 32, the single-crystal Si substrate 10 is heated by thermal conduction, thereby generating a temperature difference between the Si substrate and the transparent insulating substrate 20. As described above, since the thermal expansion coefficient of silicon crystal is larger than thermal expansion coefficient of a material used for the transparent insulating substrate, a large stress is generated between the both substrates due to the rapid expansion of the single-crystal Si substrate 10 if the single-crystal Si substrate 10 in a bonded state is heated from the rear surface thereof.

In the case of heating using a regular diffusion furnace or the like, the single-crystal Si substrate 10 and the transparent insulating substrate 20 in a bonded state are heated simultaneously. Consequently, even if a stress due to a difference in thermal expansion coefficient between two substrates is generated, stress relaxation occurs before the separation of a silicon thin film takes place due to this stress. According to the above-described method of heating, however, separation takes place at a hydrogen ion-implanted interface due to the rapid expansion of the single-crystal Si substrate 10 before the bonded substrates undergo stress relaxation.

Here, the reason for setting the temperature of the heating plate 32 to 200° C. or higher but not higher than 350° C. is because it is difficult to obtain a stress necessary for the separation of a silicon thin film at temperatures below 200° C. and because breakage easily occurs at the bonded interface of the bonded substrates if the heating plate 32 is set to a temperature above 350° C.

Note that there may be provided a sub-step of applying separation-accelerating external impact from an edge of the ion-implanted layer 11 before or after such a process of silicon thin film separation using the heating plate 32 as described above.

Figure 3A:
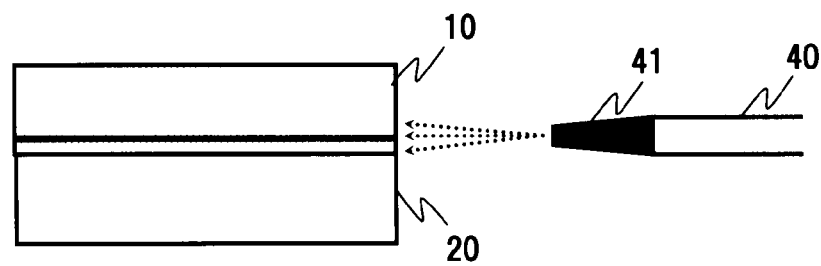
FIGS. 3(A) and (B) are conceptual schematic views used to illustrate a technique for applying external impact in a step of silicon thin film separation.
Figure 3B:
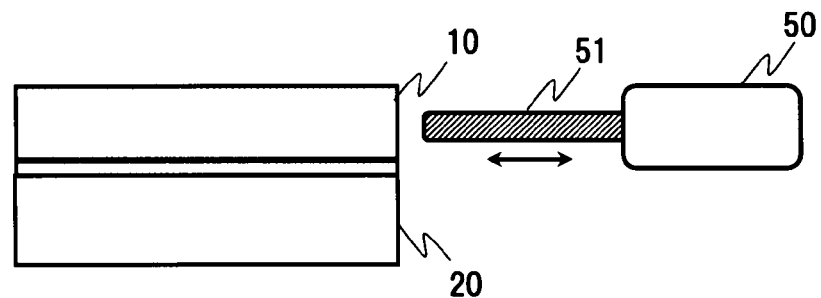

FIG. 3 is a conceptual schematic view used to illustrate a technique for applying external impact in a step of silicon thin film separation. While various techniques for applying impact are conceivable, examples of these techniques include spraying a fluid, such as a gas or a liquid, in a jet-like manner from the leading end 41 of a nozzle 40 at a side surface of the single-crystal Si substrate 10, thereby applying impact (FIG. 3(A)). An alternative technique, for example, is to apply impact by pressing the leading end 51 of a blade 50 against a region near the ion-implanted layer (FIG. 3(B)).

If such a heat treatment as described above is applied, there occurs the breakage of the chemical bonds of Si atoms having unpaired bonds and the breakage of Si—H bonds in the ion-implanted layer 11. As a result, the separation of a silicon thin film 12 from the bulk portion 13 of single-crystal silicon (FIG. 1(G)) takes place along a crystal plane at a position corresponding to a predetermined depth (average ion implantation depth L) near the surface of the single-crystal Si substrate 10. Thus, there is obtained an SOI layer 12 on the second substrate 20 (FIG. 1(H)).

According to experiments conducted by the present inventor et al., silicon thin film separation could be caused by substrate heating at 300° C. for approximately 3 seconds. The surface of the SOI layer after separation thus obtained is free from defects, such as the local separation of a silicon thin film, traces of separation and untransferred regions, and exhibits an extremely planar state. Measurement of a 10 μm×10 μm area of the surface of the SOI layer after separation using an atomic force microscope (AFM) showed that the RMS mean value was as excellent as 6 nm or less.

As described above, in the present invention, there is no need for such high-temperature processing and mechanical separation processing as used in conventional methods either in a step of bonding together the single-crystal Si substrate 10 and the transparent insulating substrate 20 or in a step of separating the SOI layer. In addition, it is possible to consistently carry out processing at low temperatures (350° C. or lower).

Since many of heretofore known methods for manufacturing an SOI substrate include a high-temperature processing step, there has been the need for special contrivance intended to avoid cracks or separation arising due to thermal strain. On the other hand, the separation process of the present invention requires neither high-temperature processing nor mechanical separation processing. It is therefore possible to provide an SOI substrate having an SOI layer superior in film uniformity, crystal quality and electrical characteristics (carrier mobility and the like). In addition, the separation process is extremely advantageous from the viewpoint of stabilizing and simplifying the manufacturing process of an SOI substrate.

INDUSTRIAL APPLICABILITY

According to the present invention, it is possible to avoid breakage, local cracks and the like due to a difference in thermal properties between substrates and the introduction of mechanical damage into an SOI layer in a step of manufacturing an SOI substrate by bonding together a single-crystal silicon substrate and a transparent insulating substrate. As a result, it is possible to provide an SOI substrate having an SOI layer superior in film uniformity, crystal quality, and electrical characteristics (carrier mobility and the like).

The invention claimed is:

1. A method for manufacturing an SOI substrate, comprising:
    (1) forming a hydrogen ion-implanted layer on the surface side of a first substrate which is a single-crystal silicon substrate;
    (2) applying a surface activation treatment to at least one of the surface of a second substrate which is a transparent insulating substrate and the surface of said first substrate;
    (3) bonding together the surface of said first substrate and the surface of said second substrate; and
    (4) forming an SOI layer on the surface of said second substrate by closely adhering the rear surface of said first substrate of said bonded substrates on a heating plate kept at a temperature of 200° C. or higher but not higher than 350° C. to heat said first substrate and thereby peel off a silicon layer from said first substrate,
    wherein (3) includes a sub-step of heat-treating said first substrate and said second substrate at 100 to 350° C. after said bonding, with said first and second substrates bonded together.

2. The method of claim 1, wherein said second substrate is a quartz substrate, a sapphire (alumina) substrate, a borosilicate glass substrate, or a crystallized glass substrate.

3. The method of claim 1, wherein the amount of hydrogen ion implantation (dose amount) in (1) is $1\times10^{16}$ to $5\times10^{17}$ atoms/cm$^2$.

4. The method of claim 1, wherein said surface activation treatment in (2) is carried out by at least one of plasma treatment and ozone treatment.

5. The method of claim 1, wherein said heating plate used in (4) is one of a semiconductor substrate and a ceramic substrate having a smooth surface.

6. The method of claim 1, wherein (4) includes a sub-step of applying separation-accelerating external impact from an edge of said hydrogen ion-implanted layer before or after the heating of said first substrate.

7. The method of claim 1, wherein the hydrogen ion implantation depth is 0.5 μm or less.

8. The method of claim 1, wherein the hydrogen ion implantation forms a micrrobubble layer locally in a region at a depth corresponding to the average ion implantation depth.

9. The method of claim 8, wherein the microbubble layer contains Si atoms having unpaired bonds and high density Si—H bonds.

* * * * *